United States Patent
Tong et al.

(10) Patent No.: US 10,624,196 B1
(45) Date of Patent: Apr. 14, 2020

(54) LASER SOURCE DEVICE AND EXTREME ULTRAVIOLET LITHOGRAPHY DEVICE

(71) Applicant: TAIWAN SEMICONDUCTOR MANUFACTURING CO., LTD., Hsinchu (TW)

(72) Inventors: Henry Yee-Shian Tong, Taoyuan (TW); Wen-Chih Wang, New Taipei (TW); Hsin-Liang Chen, Hsinchu (TW); Louis Chun-Lin Chang, Hsinchu County (TW); Cheng-Chieh Chen, Tainan (TW); Li-Jui Chen, Hsinchu (TW); Po-Chung Cheng, Chiayi County (TW); Jeng-Yann Tsay, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/242,093

(22) Filed: Jan. 8, 2019

Related U.S. Application Data

(60) Provisional application No. 62/737,873, filed on Sep. 27, 2018.

(51) Int. Cl.
*G01J 3/443* (2006.01)
*H05G 2/00* (2006.01)
*G03F 7/20* (2006.01)
*G01J 3/02* (2006.01)

(52) U.S. Cl.
CPC ............ *H05G 2/008* (2013.01); *G01J 3/443* (2013.01); *G03F 7/70033* (2013.01); *G01J 3/0202* (2013.01)

(58) Field of Classification Search
CPC ...... G01J 3/443; G03F 7/70033; H05G 2/008; G01N 21/67
See application file for complete search history.

(56) References Cited

U.S. PATENT DOCUMENTS

| | | | |
|---|---|---|---|
| 2007/0075051 A1* | 4/2007 | Morrisroe | H05H 1/30 219/121.52 |
| 2011/0134433 A1* | 6/2011 | Yamada | A61B 5/0062 356/479 |

* cited by examiner

*Primary Examiner* — Eliza W Osenbaugh-Stewart
(74) *Attorney, Agent, or Firm* — McClure, Qualey & Rodack, LLP

(57) ABSTRACT

A device includes a laser source, an amplifier, an optical sensor and a spectrometer. The laser source is configured to produce a seed laser beam. The amplifier includes gain medium and a discharging unit. The discharging unit is configured to pump the gain medium for amplifying power of the seed laser beam. The optical sensor is coupled to the amplifier and configured for sensing an optical emission generated in the amplifier while the gain medium is discharging. The spectrometer is coupled with the optical sensor and configured to measure a spectrum of the optical emission.

20 Claims, 7 Drawing Sheets

LASER SOURCE DEVICE AND EXTREME ULTRAVIOLET LITHOGRAPHY DEVICE

CROSS-REFERENCE TO RELATED APPLICATION

This application claims priority to U.S. Provisional Application Ser. No. 62/737,873, filed on Sep. 27, 2018, which is herein incorporated by reference.

BACKGROUND

In semiconductor fabrication processes, increased density of integrated circuits has increased the complexity of processing and manufacturing ICs. There is a need to perform lithography processes with higher resolution. One of the leading lithography techniques is an extreme ultraviolet (EUV) lithography. Others include X-Ray lithography, ion beam projection lithography, and electron-beam projection lithography. EUV light with a wavelength around 5-100 nm or less can be used in photolithography processes to produce extremely small patterns on semiconductor wafers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
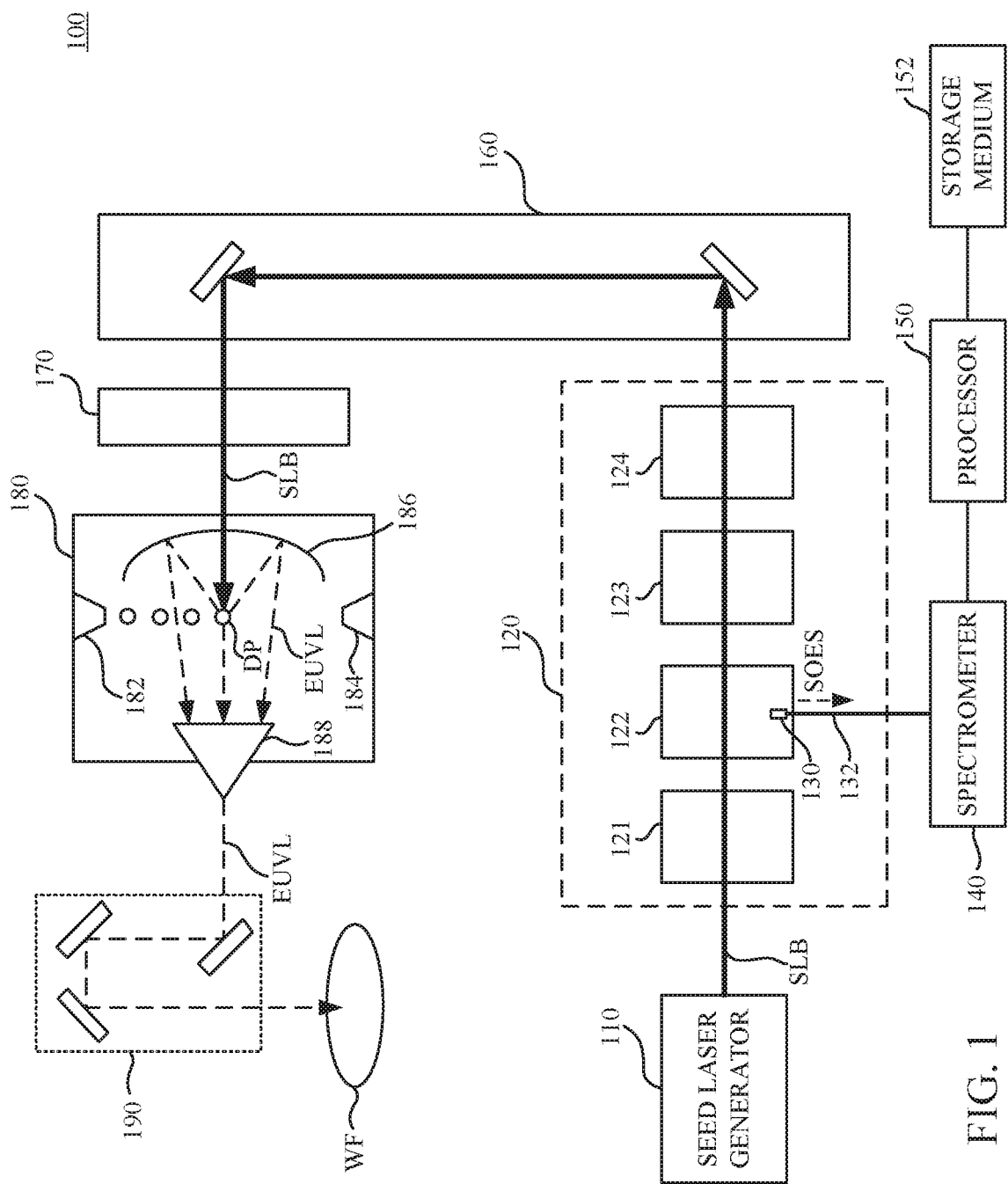
FIG. 1 is a schematic diagram of a device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

FIG. 1 is a schematic diagram of a device 100, in accordance with some embodiments of the present disclosure.

As illustratively shown in FIG. 1, the device 100 includes a laser source 110, an amplifier 120, an optical sensor 130, a spectrometer 140, a processor 150, a beam transport system (BTS) 160, a laser focus unit 170 and an extreme ultraviolet (EUV) generating vessel 180. In some embodiments, the device 100 is a laser produced plasma extremely ultra violet (LPP-EUV) light source which is capable of generating an extreme ultraviolet light EUVL. The extreme ultraviolet light EUVL has a wavelength about 5 nm to about 100 nm. In some embodiments, the extreme ultraviolet light EUVL has a wavelength about 13.5 nm.

As illustratively shown in FIG. 1, in some embodiments, the device 100 further includes optical components 190, and the extreme ultraviolet light EUVL is guided through optical components 190 onto a wafer WF. In some embodiments, the device 100 is an extreme ultraviolet lithography equipment, which is capable of generating the extreme ultraviolet light EUVL and utilizing the extreme ultraviolet light EUVL to form a pattern onto the wafer WF.

Figure 2:
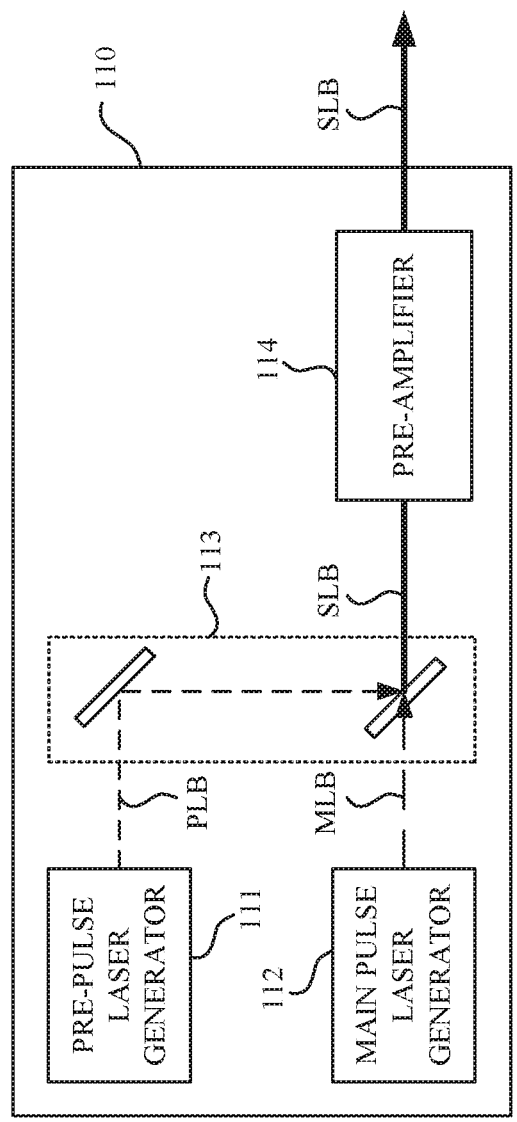
FIG. 2 is a schematic diagram of the laser source in FIG. 1 in accordance with some embodiments of the present disclosure.

The laser source 110 is configured to produce a seed laser beam SLB. Reference is further made to FIG. 2. FIG. 2 is a schematic diagram of the laser source 110 in FIG. 1, in accordance with some embodiments of the present disclosure. As illustratively shown in FIG. 2, in some embodiments, the laser source 110 includes a pre-pulse laser generator 111, a main pulse laser generator 112, a beam combiner 113 and a pre-amplifier 114. The pre-pulse laser generator 111 is configured to produce a pre-pulse laser beam PLB. The main pulse laser generator 112 is configured to produce a main pulse laser beam MLB. The pre-pulse laser beam PLB has a wavelength different from a wavelength of the main pulse laser beam MLB. In some embodiments, the wavelength of the pre-pulse laser beam PLB and the main pulse laser beam MLB are in a range from about 9 μm to about 12 μm. In some embodiments, the pre-pulse laser generator 111 and the main pulse laser generator 112 can be gas-discharge $CO_2$ laser generators. In other embodiments, other suitable laser generators, for examples, an excimer or molecular fluorine laser, may be used for the pre-pulse laser generator 111 and the main pulse laser generator 112 shown in FIG. 2.

As illustratively shown in FIG. 2, in some embodiments, the beam combiner 113 is configured for combining the main pulse laser beam MLB and the pre-pulse laser beam PLB onto one optical path to form the seed laser beam SLB. In the embodiments illustratively shown in FIG. 2, the seed laser beam SLB is a combination of the main pulse laser beam MLB and the pre-pulse laser beam PLB. In some other embodiments, the seed laser beam SLB includes one laser beam, for example the main pulse laser beam MLB or the pre-pulse laser beam PLB, produced by one gas-discharge laser generator. The pre-amplifier 114 is configured to enhance power of the seed laser beam SLB. In some embodiments, the pre-amplifier 114 is able to modulate the power of the seed laser beam SLB to about 1 kW to about 5 kW.

As illustratively shown in FIG. 1, the seed laser beam SLB produced by the laser source 110 transmits through the amplifier 120 to the beam transport system (BTS) 160. Afterward, the seed laser beam SLB is utilized to excite a target droplet DP in the extreme ultraviolet generating vessel 180 for producing the extreme ultraviolet light EUVL. In order to effectively excite a target droplet DP in the extreme ultraviolet generating vessel 180, the seed laser beam SLB is required to have enough power. The amplifier 120 is utilized to amplify power of the seed laser beam SLB. In some embodiments, the amplifier 120 is able to modulate the power of the seed laser beam SLB to about 5 kW to about 15 kW.

As illustratively shown in FIG. 1, in some embodiments, the amplifier 120 includes four stages of amplifier components 121, 122, 123 and 124 positioned along an optical path of the seed laser beam SLB, but the present disclosure is not limited in this regard. The number and configuration of the amplifier 120 in following embodiments are given for illustrative purposes. In some other embodiments, the amplifier 120 includes at least one amplifier component to amplify power of the seed laser beam SLB.

The seed laser beam SLB after processed by the amplifier 120 is transmitted through the beam transport system 160 to the extreme ultraviolet generating vessel 180. In some embodiments, the laser source 110 and the amplifier 120 may be implemented at one location, for example a ground floor or underground of a factory, and the extreme ultraviolet generating vessel 180 and the optical components 190 may be implemented at another location, for example a first floor or a second floor of the factory. In some embodiments, the beam transport system 160 is configured to transport the seed laser beam SLB between two locations with minimum leakage.

As illustratively shown in FIG. 1, in some embodiments, the laser focus unit 170 is disposed between the beam transport system 160 and the extreme ultraviolet generating vessel 180. The laser focus unit 170 is configured to make the seed laser beam SLB converge at a point precisely to excite the target droplet DP in the extreme ultraviolet generating vessel 180.

As illustratively shown in FIG. 1, in some embodiments, the extreme ultraviolet generating vessel 180 includes a droplet generator 182, a droplet catcher 184, an extreme ultraviolet collector 186 and an intermediate focus unit 188. The droplet generator 182 is configured to provide the target droplet DP. In some embodiments, the target droplet DP is a tin-doped droplet. The droplet catcher 184 is configured to catch and remove the target droplet DP after being impacted by the seed laser beam SLB. The target droplet DP excited by the seed laser beam SLB will become laser-produced plasma, and the laser-produced plasma will produce the extreme ultraviolet light EUVL in different directions. The extreme ultraviolet collector 186 is configured to gather the extreme ultraviolet light EUVL onto the intermediate focus unit 188. The intermediate focus unit 188 is configured to make the seed laser beam SLB converge the extreme ultraviolet light EUVL onto one optical path. The extreme ultraviolet light EUVL converged by the intermediate focus unit 188 can be utilized by optical components 190 for extreme ultraviolet lithography. As illustratively shown in FIG. 1, in some embodiments, the optical components 190 include at least one illuminator mirror and at least one reticle mask for forming a pattern on the wafer WF.

In some embodiments, the optical sensor 130 is coupled to the amplifier 120 and is configured for sensing an optical emission generated in the amplifier 120. As illustratively shown in FIG. 1, in some embodiments, the amplifier 120 includes four stages of amplifier components 121, 122, 123 and 124. As a demonstrational example, the optical sensor 130 is disposed in the amplifier component 122 of the amplifier 120. As illustratively shown in FIG. 1, in some embodiments, the optical sensor 130 is able to sense the optical emission at the second stage, i.e., the amplifier component 122, while the seed laser beam SLB is amplifying in the four consequent stages of the amplifier 120.

Figure 3:
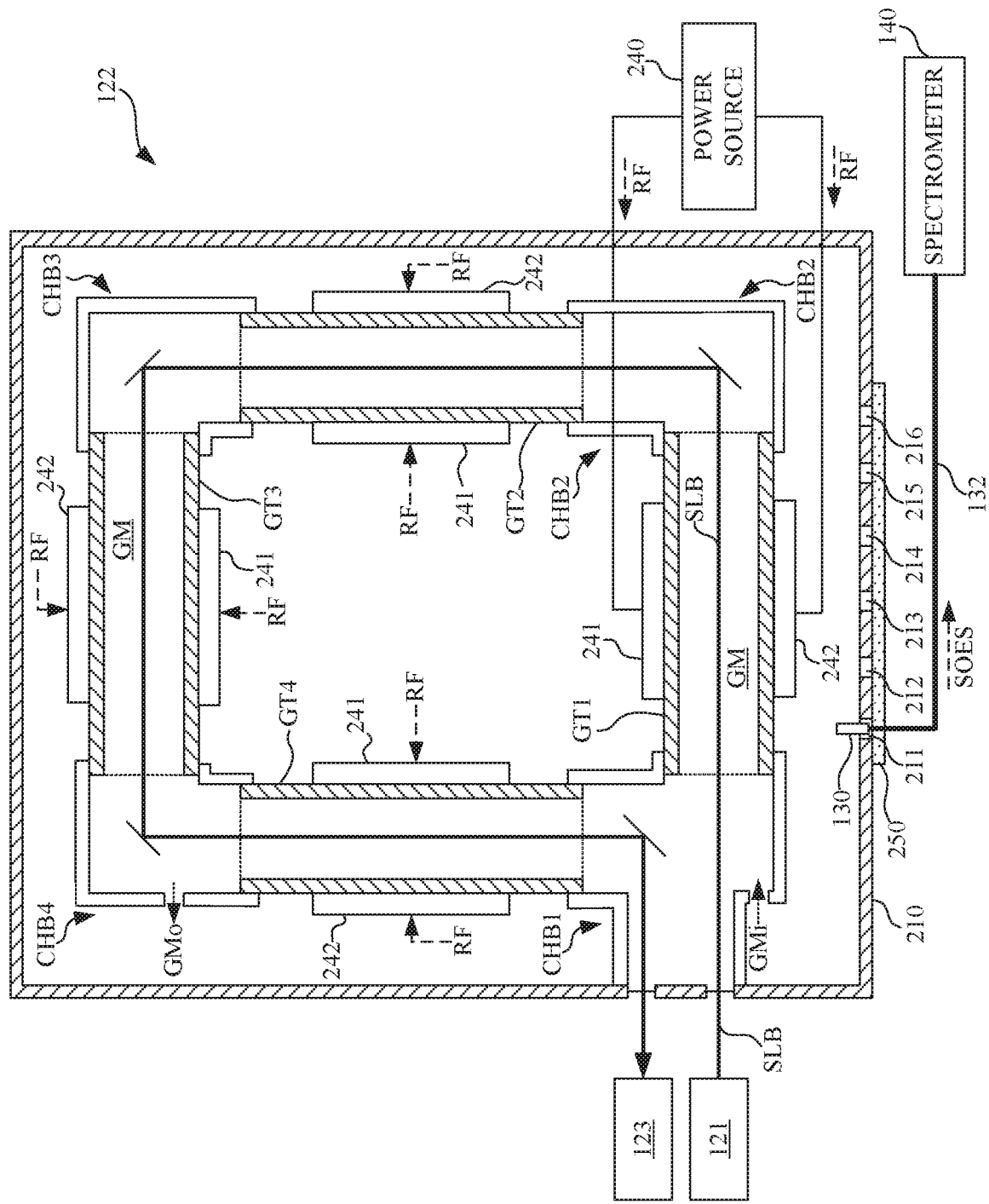
FIG. 3 is a schematic diagram of the amplifier component in FIG. 1 in accordance with some embodiments of the present disclosure.

In some other embodiments, the optical sensor 130 can be disposed at least one of the amplifier components 121-124. For example, the optical sensor 130 can be disposed in the amplifier component 121, 123 or 124 in some embodiments. Alternatively, two or more optical sensors can be disposed two of more amplifier components 121-124. The optical sensor 130 disposed in the amplifier component 122 in following embodiments are given for illustrative purposes. However, the disclosure is not limited thereto. Reference is further made to FIG. 3. FIG. 3 is a schematic diagram of the amplifier component 122 in FIG. 1, in accordance with some embodiments of the present disclosure. As illustratively shown in FIG. 1 and FIG. 3, in some embodiments, the amplifier component 122 is located between the amplifier component 121 and the amplifier component 123. The amplifier component 122 receives the seed laser beam SLB amplified by the amplifier component 121. The amplifier component 122 is configured to further amplify the seed laser beam SLB and send the seed laser beam SLB to the amplifier component 123.

As illustratively shown in FIG. 3, the amplifier component 122 includes a shielding 210, glass tubes GT1, GT2, GT3 and GT4, connection chambers CHB1, CHB2, CHB3 and CHB4, a discharging unit, gain medium GM and an ultraviolet blocking cover 250. The shielding 210 is an external surface of the amplifier component 122. The glass tubes GT1, GT2, GT3 and GT4 are disposed in the shielding 210 and configured to accommodate the gain medium GM. In some embodiments, the glass tubes GT1, GT2, GT3 and GT4 are quartz tubes. In some embodiments, the gain medium GM is a gas mixture includes carbon dioxide, $CO_2$, and nitrogen, $N_2$. In some embodiments, the gas mixture accommodated inside the glass tubes GT1, GT2, GT3 and GT4 further includes helium, He, for stabilizing the gas mixture. Helium is not utilized as an active gain medium. The discharging unit includes a power source 240 and electrodes 241 and 242 disposed adjacent to the glass tubes GT1-GT4.

In some embodiments, the electrodes 241 are utilized as anode electrodes and the electrodes 241 are utilized as cathode electrodes 242 on each of the glass tubes GT1-GT4. The power source 240 provides radio-frequency signals RF. The radio-frequency signals RF are applied on the electrodes 241 and 242 disposed on opposite sides of each of the glass tubes GT1-GT4 for pumping the gain medium GM. In order to keep brevity of FIG. 3, wirings for transmitting the radio-frequency signals RF between the power source 240 to the electrodes 241 and 242 on the glass tube GT1 is illustrated, and similar wirings for transmitting the radio-frequency signals RF to the electrodes 241 and 242 on the glass tubes GT2-GT4 are not shown in FIG. 3. The radio-frequency signals RF are configured to boost an energy level of the gain medium GM in the glass tubes GT1, GT2, GT3 and GT4. When the seed laser beam SLB travels through the glass tubes GT1, GT2, GT3 and GT4, the seed laser beam SLB will absorb energy from the gain medium GM, such that the power of the seed laser beam SLB will be amplified.

As illustratively shown in FIG. 3, the connection chambers CHB1, CHB2, CHB3 and CHB4 are configured to connect the glass tubes GT1, GT2, GT3 and GT4 and guide the optical path of the seed laser beam SLB. As illustratively shown in FIG. 3, in some embodiments, a fluid inlet GMi is implemented at the connection chamber CHB1 and a fluid outlet GMo is implemented at the connection chamber CHB4. In some embodiments, the gain medium GM is provided from a gas pipeline, not shown in figures, to the fluid inlet GMi. The gain medium GM flows from the fluid inlet GMi to the fluid outlet GMo.

In the embodiment illustratively shown in FIG. 3, the amplifier component 122 includes four glass tubes GT1-GT4 and four connection chambers CHB1-CHB4 for connecting between the glass tubes GT1-GT4. However, the number and configuration of the glass tubes and the connection chambers in the amplifier component 122 are given for illustrative purposes. In some other embodiments, the amplifier component 122 includes at least one glass tube and corresponding connection chambers. In some embodiments, the amplifier component 122 may include twelve glass tubes or more for further amplifying the power of the seed laser beam SLB.

As illustratively shown in FIG. 3, in some embodiments, the optical sensor 130 is disposed in the amplifier component 122. There is at least one opening formed on the shielding 210. As illustratively shown in FIG. 3, there are six openings 211-216 formed on different positions on the shielding 210. As illustratively shown in FIG. 3, in some embodiments, an upper end of the optical sensor 130 is disposed inside the shielding 130 and a lower end of the optical sensor 130 penetrates the shielding 210 through the opening 211. The optical sensor 130 disposed in the shielding 210 of the amplifier component 122 is able to sense an optical emission generated in the amplifier component 122 while the gain medium GM is discharging, and the optical sensor 130 will generate an optical emission signal SOES describing the optical emission. As illustratively shown in FIG. 3, the ultraviolet blocking cover 250 is disposed over the openings 211-216 on the shielding 210 for blocking a leakage of the seed laser beam SLB or the optical emission.

As illustratively shown in FIG. 3, in some embodiments, the optical sensor 130 is disposed at the opening 211, which is relatively adjacent to the fluid inlet GMi and relatively away from the fluid outlet GMo. In this configuration illustratively shown in FIG. 3, the optical sensor 130 is able to sense the optical emission adjacent to the fluid inlet GMi, such that the optical emission signal SOES is highly related to an inlet flow rate of the gain medium GM. In some other embodiments, the optical sensor 130 can be adjusted to be implement at different opening 212-216 to sense the optical emission from different locations of the amplifier component 122, and the optical emission signal SOES can reflect more information about different conditions, e.g., an outlet flow rate, of the amplifier component 122. In some embodiments, the optical sensor 130 includes Optical Emission Spectrometry (OES) sensor head. The Optical Emission Spectrometry sensor head is able to generate the optical emission signal SOES with a sample rate about 10 samples per second to about 15 samples per second.

As illustratively shown in FIG. 1 and FIG. 3, in some embodiments, an optical fiber cable 132 is configured for transmitting the optical emission signal SOES generated by the optical sensor 130 to the spectrometer 140. One end of the optical fiber penetrates through the ultraviolet blocking cover 250 and is connected to the optical sensor 130. Another end of the optical fiber cable 132 is connected to the spectrometer 140.

As illustratively shown in FIG. 1 and FIG. 3, the spectrometer 140 is coupled with the optical sensor 130 and configured to measure a spectrum of the optical emission. The processor 150 is coupled with the spectrometer 140, and the processor 150 is configured to determine an operational status of the amplifier 120 according to the spectrum of the optical emission. Further details about how to determine the operational status of the amplifier 120 according to the spectrum will be explained and discussed in following paragraphs.

As illustratively shown in FIG. 1, in some embodiments, the processor 150 is coupled to the spectrometer 140 and a storage medium 152. In various embodiments, the processor 150 is a central processing unit (CPU), an application specific integrated circuit (ASIC), a multi-cores processor, a distributed processing system, or a suitable processing unit. Various circuits or units to implement the processor 150 are within the contemplated scope of the present disclosure.

The storage medium 152 stores one or more program codes for performing some tasks on the processor 150. For illustration, the storage medium 152 stores program codes encoded with executable instructions for performing some tasks on the processor 150. The processor 150 is able to access the program codes stored in the storage medium 152.

In some embodiments, the storage medium 152 is a non-transitory computer readable storage medium encoded with, i.e., storing, a set of executable instructions for performing aforesaid tasks on the processor 150. In some embodiments, the non-transitory computer readable storage medium is an electronic, magnetic, optical, electromagnetic, infrared, and/or a semiconductor system (or apparatus or device). For example, the computer readable storage medium includes a semiconductor or solid-state memory, a magnetic tape, a removable computer diskette, a random access memory (RAM), a read-only memory (ROM), a rigid magnetic disk, and/or an optical disk. In one or more embodiments using optical disks, the computer readable storage medium includes a compact disk-read only memory (CD-ROM), a compact disk-read/write (CD-R/W), and/or a digital video disc (DVD).

Figure 4:
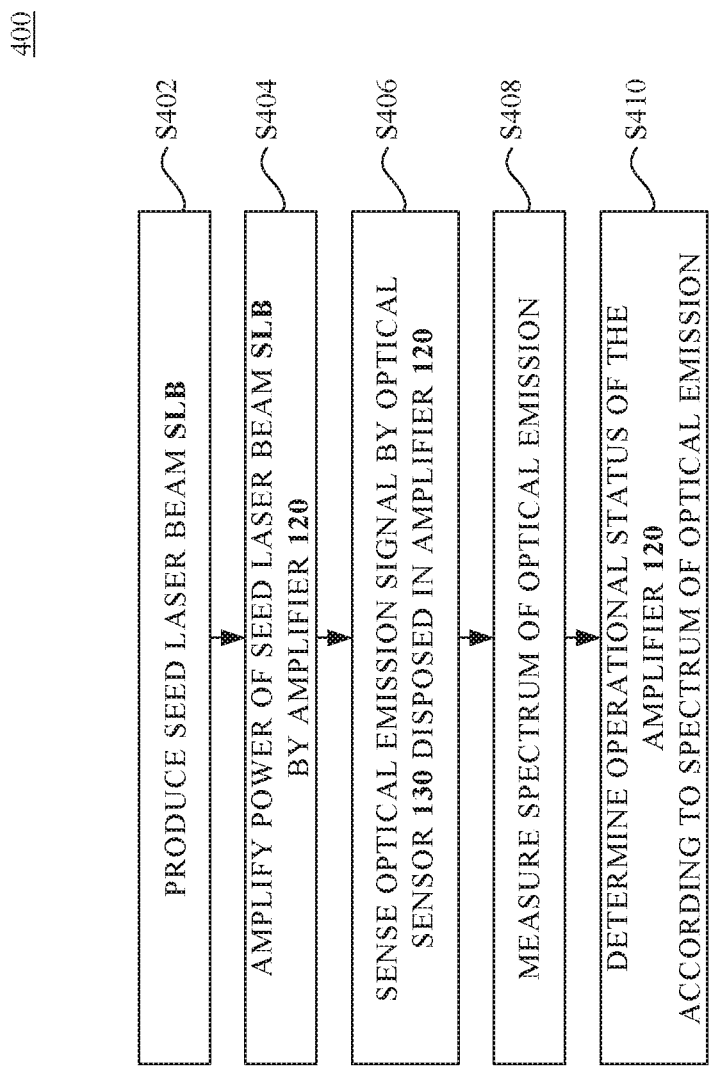
FIG. 4 is a flow chart of a method suitable to be applied on the device in FIG. 1, FIG. 2 and FIG. 3, in accordance with some embodiments of the present disclosure.

Reference is now made to FIG. 4. FIG. 4 is a flow chart of a method 400 suitable to be applied on the device 100 in FIG. 1, FIG. 2 and FIG. 3, in accordance with some embodiments of the present disclosure. For ease of understanding, as an example, the method 400 is described below with reference to FIG. 1, FIG. 2 and FIG. 3.

For illustration, the method 400 in FIG. 4 includes operations S402-S410. In operation S402, the laser source 110 is configured to produce a seed laser beam SLB. In operation S404, the amplifier 120 is configured to amplify the power of the seed laser beam SLB. During operation S404, as illustratively shown in FIG. 3 and FIG. 4, the power source 240 applies the radio-frequency signals RF on the electrodes 241 and 242 for pumping the gain medium GM. The seed laser beam SLB is directed through the gain medium GM. The seed laser beam SLB absorb the energy from the gain medium GM, such that the power of the seed laser beam SLB is amplified. As illustratively shown in FIG. 3 and FIG. 4, in operation S406, the optical sensor 130 disposed in the amplifier component 122 senses the optical emission generated in the amplifier component 122 while the gain medium GM is discharging. In operation S408, the spectrometer 140 measures the spectrum of the optical emission. In operation S410, the processor 150 determines an operational status of the amplifier 120 according to the spectrum of the optical emission.

Figure 5:
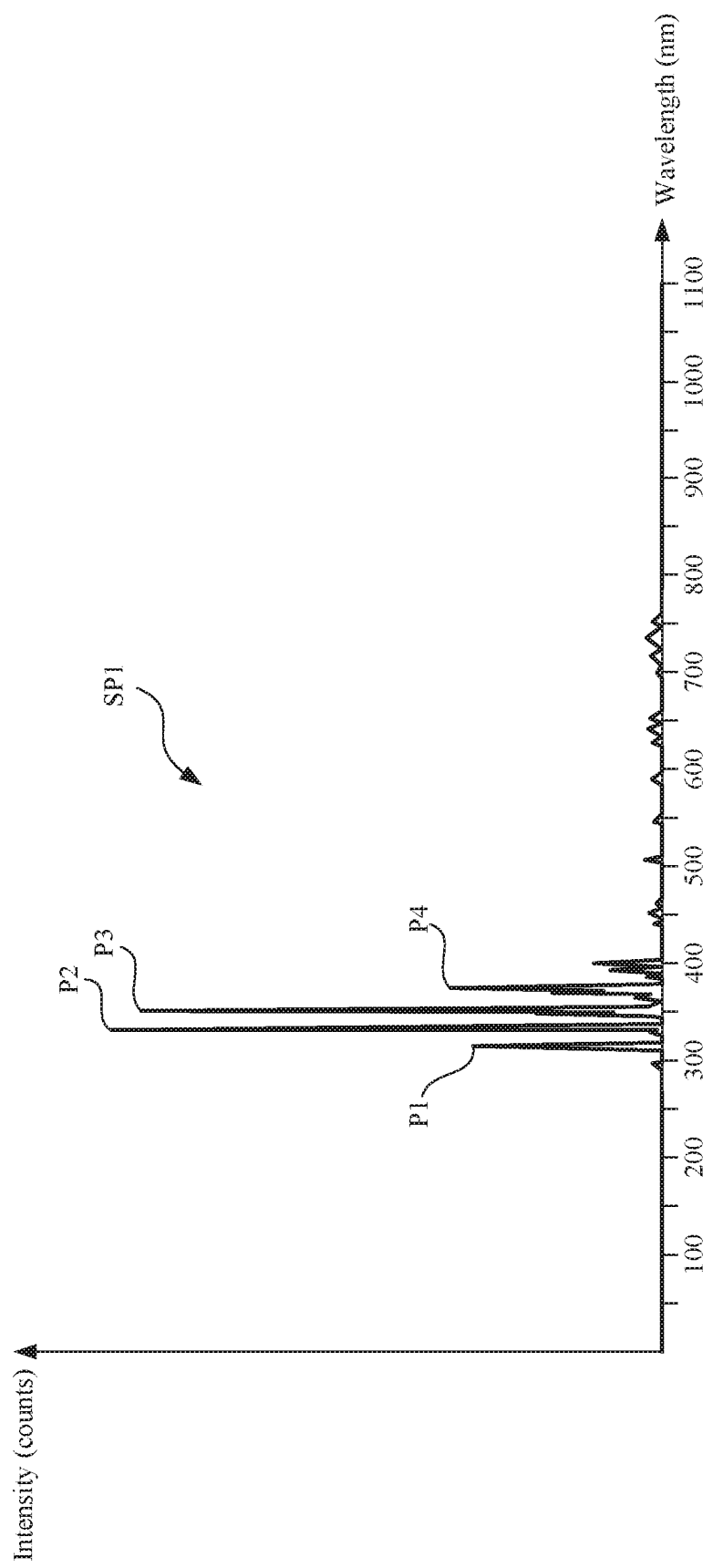
FIG. 5 is a schematic diagram illustrating a spectrum of the optical emission measured by the spectrometer in accordance with some embodiments of the present disclosure.

Reference is further made to FIG. 5, which is a schematic diagram illustrating a spectrum SP1 of the optical emission measured by the spectrometer 140, in accordance with some embodiments of the present disclosure. As illustratively shown in FIG. 5, in some embodiments, the spectrum SP1 of the optical emission indicates intensities of the optical emission at different wavelengths. The spectrum SP1 reflects the optical emission include different beam components at different wavelengths mainly ranged from about 200 nm to about 1100 nm.

In some embodiments, the processor is configured to analyze the spectrum SP1 based on the waveform and a peak distribution of the spectrum SP1. As illustratively shown in FIG. 5, the spectrum SP1 has four peaks P1-P4. The peak P1 is located at about 315 nm corresponding to an emission band induced by carbon dioxide, $CO_2$. The peak P2 is located at about 336 nm corresponding to an emission band induced by carbon dioxide, $CO_2$. The peak P3 is located at about 357 nm corresponding to another emission band induced by carbon dioxide, $CO_2$. The peak P4 is located at about 375 nm corresponding to still another emission band induced by carbon dioxide, $CO_2$. The four peaks P1-P4 are listed for demonstration. The processor 150 may capture and analyze further peaks, for example, peaks from about 300 nm to about 800 nm in the spectrum SP1 for more details.

In some embodiments, the spectrum SP1 is a standard spectrum recorded when the device 100 and the amplifier 120 operating in a normal status. The spectrum SP1 can be stored in the storage medium 152 for reference.

Figure 6:
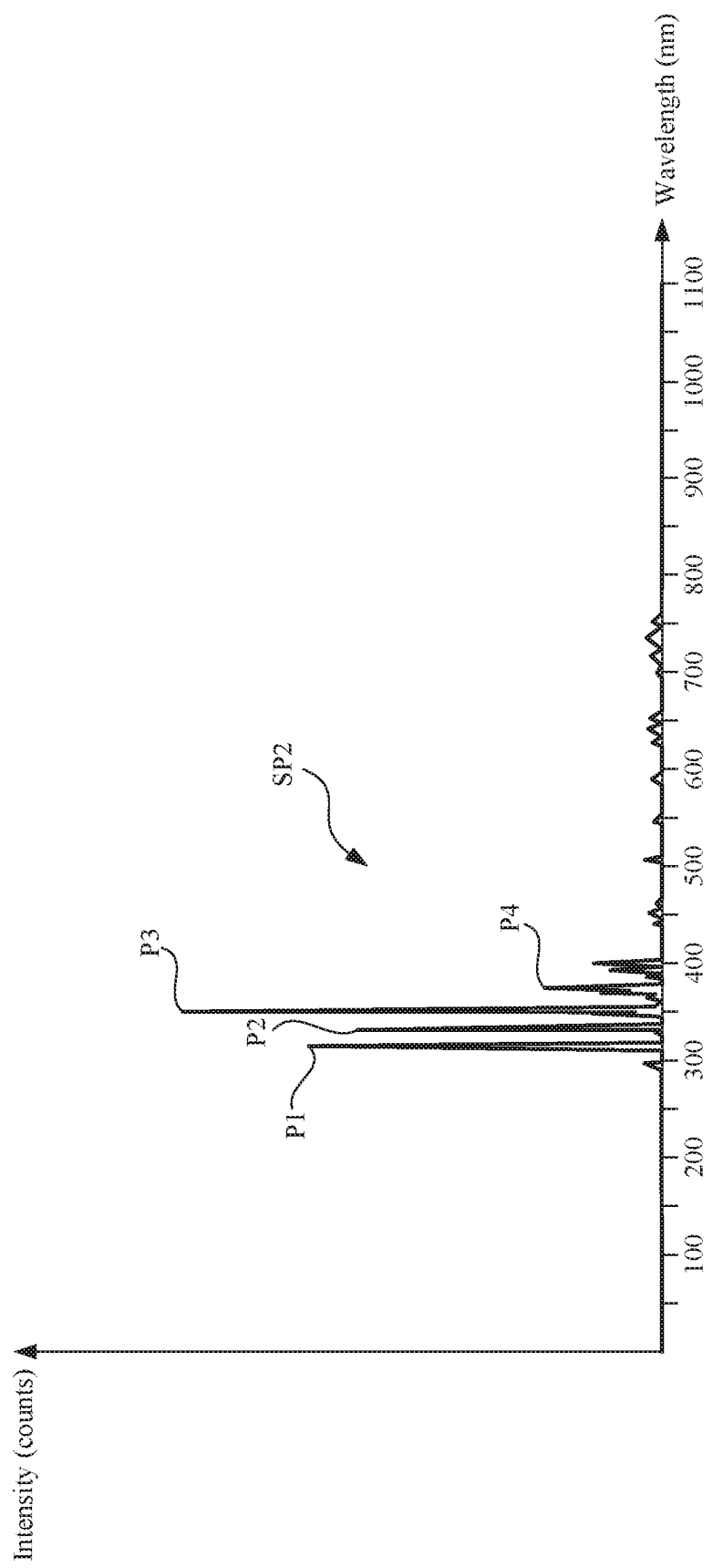
FIG. 6 is a schematic diagram illustrating another spectrum of the optical emission measured by the spectrometer in accordance with some embodiments of the present disclosure.

Reference is further made to FIG. 6, which is a schematic diagram illustrating another spectrum SP2 of the optical emission measured by the spectrometer 140, in accordance with some embodiments of the present disclosure. As illustratively shown in FIG. 6, in some embodiments, the spectrum SP2 of the optical emission indicates intensities of the optical emission at different wavelengths. As illustratively shown in FIG. 6, the spectrum SP2 has corresponding four peaks P1-P4. The peak P1 is located at about 315 nm corresponding to an emission band induced by nitrogen, $N_2$. The peak P2 is located at about 336 nm corresponding to an emission band induced by carbon dioxide, $CO_2$.

In some embodiments, when the spectrum SP2 is measured by the spectrometer 140, the processor 150 is configured to compare the spectrum SP2 in reference with the spectrum SP1 stored in the storage medium 152. Because the spectrum SP2 is different from the spectrum SP1 regard as the standard spectrum, the processor 150 is able to determine that the device 100 or the amplifier 120 is currently in an abnormal status.

Compared to the spectrum SP1 regarded as the standard spectrum in FIG. 5, an intensity of the peak P2 of the spectrum SP2 in FIG. 6 is lower than an intensity of the peak P2 of the spectrum SP1, and intensities of the peaks P1 and P3 of the spectrum SP2 in FIG. 6 is higher than intensities of the peak P1 and P3 of the spectrum SP1. Accordingly, the processor 150 is able to determine that the abnormal status can be related to an inlet flow rate of the gain medium GM is currently lower than a standard rate, or the abnormal status can be a ratio of the carbon dioxide, $CO_2$ in the gas mixture of the gain medium GM is lower than a standard ratio. In some embodiments, the processor 150 is able to analyze the abnormal status according to a difference between the spectrum SP2 in FIG. 6 and the spectrum SP1 in FIG. 5. In some embodiments, the processor 150 is able to analyze a setting of the radio-frequency signals RF, which are applied on the electrodes of the glass tubes GT1-GT4 in FIG. 3 for pumping the gain medium GM, according to the difference between the spectrum SP2 in FIG. 6 and the spectrum SP1 in FIG. 5.

Figure 7:
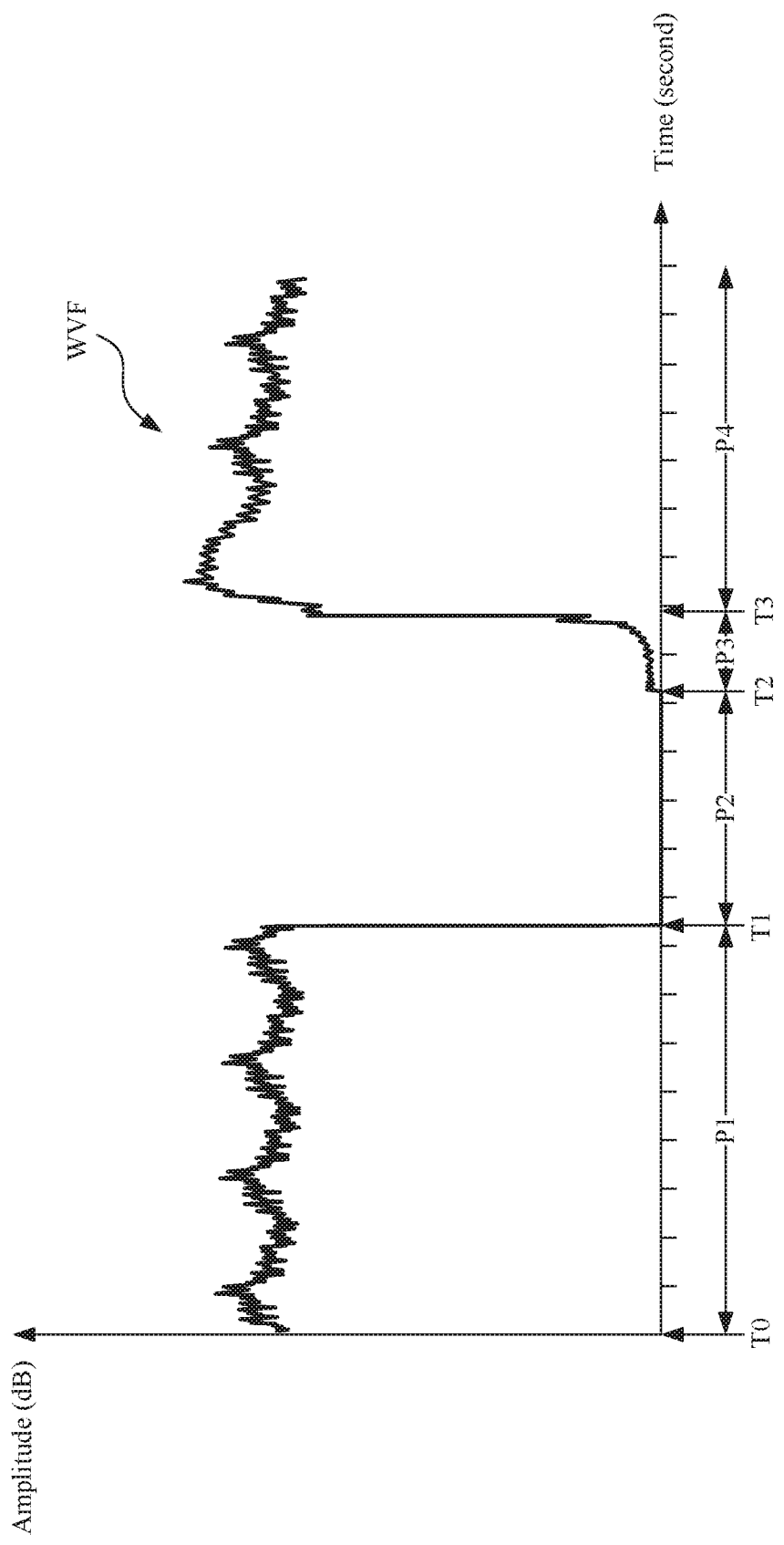
FIG. 7 illustrates a waveform diagram of a waveform of the optical emission plotted by the spectrometer in accordance with some embodiments of the present disclosure.

Reference is further made to FIG. 7, which illustrates a waveform diagram of a waveform WVF of the optical emission plotted by the spectrometer 140, in accordance with some embodiments of the present disclosure. In FIG. 7, the waveform WVF reflects an amplitude variation of the optical emission over time. The waveform WVF in a period P1 between a time point T0 and another time point T1 reflects the amplitude variation of the optical emission when the device 100 is operating. During the period P1, the laser source 110 and the amplifier 120 is activated to work. The waveform WVF of the optical emission will have a characteristic of a glowing light. The amplitude of the waveform WVF varies up and down periodically in the period P1. It is assumed that the laser source 110 and the amplifier 120 at the time point T1, and the amplitude of the waveform WVF during a period P2 returns to a low level, e.g., zero. It is assumed that the laser source 110 and the amplifier 120 restarts at a time point T2. It can be observed that the waveform WVF during a period P3 starts to climb up to a high level. The waveform WVF during a period P4 will resume to a normal status, similar to the period P1, with the characteristic of the glowing light.

In some embodiments, the period P3 is regarded as an ignition phase of the laser source 110 and the amplifier 120. The ignition phase can be observed in the period P3 of the waveform WVF because the optical sensor 130, in some embodiments, including the Optical Emission Spectrometry (OES) sensor head with the sample rate about 10 samples per second to about 15 samples per second. In some approaches, a rejected power returned from the amplifier 120 can be measured at an interface between the laser source 110 and the amplifier 120, and the rejected power is measured at a sample rate about 1 sample every 12 seconds. In those approaches, it is hard to observe the ignition phase in the rejected power returned from the amplifier 120 to the laser source 110. As illustratively shown in FIG. 7, the waveform WVF during the period P3 of the optical emission plotted by the spectrometer 140 is able to reflect the ignition phase of the laser source 110 and the amplifier 120. The processor 150 is able to analyze the ignition phase of the laser source 110 and the amplifier 120 according to the waveform WVF during the period P3.

The predetermined sequences, including the ascending numerical order and/or the descending numerical order, are given for illustrative purposes only. Various kinds of orders are within the contemplated scope of the present disclosure.

For ease of understanding, the embodiments above are given with an application of fabricating two switches. The embodiments above are able to be applied to fabricate a single switch or two more switches. For illustrative purposes, the embodiments above are described as implementing the switches. The present disclosure is not limited thereto. Various elements are able to be implemented according to the embodiments above, and thus are the contemplated scope of the present disclosure.

In this document, the term "coupled" may also be termed as "electrically coupled," and the term "connected" may be termed as "electrically connected". "Coupled" and "connected" may also be used to indicate that two or more elements cooperate or interact with each other.

In some embodiments, a device including a laser source, an amplifier, an optical sensor and a spectrometer is disclosed. The laser source is configured to produce a seed laser beam. The amplifier includes gain medium and a discharging unit. The discharging unit is configured to pump the gain medium for amplifying power of the seed laser beam. The optical sensor is coupled to the amplifier and configured for sensing an optical emission generated in the amplifier while the gain medium is discharging. The spectrometer is coupled with the optical sensor and configured to measure a spectrum of the optical emission.

Also disclosed is a method that includes the operation below. A seed laser beam is produced by a laser source. Power of the seed laser beam by an amplifier is amplified. An optical emission is sensed by an optical sensor disposed in the amplifier. A spectrum of the optical emission is measured. An operational status of the amplifier is determined according to the spectrum of the optical emission.

Also disclosed is a device that includes a laser source, an extreme ultraviolet generating vessel, an optical component, an optical sensor and a spectrometer. The laser source is configured to produce a seed laser beam. The seed laser beam being is directed to the extreme ultraviolet generating vessel to form laser-produced plasma. The laser-produced plasma is configured to generate an extreme ultraviolet light. The extreme ultraviolet light transmitting through the optical component is utilized to in lithographing a wafer. The optical sensor is configured for sensing an optical emission generated while the seed laser beam is amplified before entering the extreme ultraviolet generating vessel. The spectrometer is coupled with the optical sensor and configured to measure a spectrum of the optical emission.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a laser source configured to produce a seed laser beam;
an amplifier comprising gain medium and a discharging unit, the discharging unit being configured to pump the gain medium for amplifying power of the seed laser beam;
an optical sensor coupled to the amplifier and configured for sensing an optical emission generated in the amplifier while the gain medium is discharging; and
a spectrometer coupled with the optical sensor and configured to measure a spectrum of the optical emission.

2. The device of claim 1, further comprising:
a processor coupled with the spectrometer and configured to determine an operational status of the amplifier according to the spectrum of the optical emission.

3. The device of claim 1, wherein the gain medium is a gas mixture comprising carbon dioxide and nitrogen.

4. The device of claim 1, wherein the amplifier comprises:
a plurality of amplifier components positioned along an optical path of the seed laser beam, the seed laser beam being sequentially amplified by the amplifier components, the optical sensor is coupled to one of the amplifier components.

5. The device of claim 1, wherein the amplifier comprises:
a shielding; and
a glass tube disposed in the shielding and configured to accommodate the gain medium,
wherein the discharging unit comprises a plurality of electrodes disposed adjacent to the glass tube, and a radio-frequency signal is applied on the electrodes for pumping the gain medium.

6. The device of claim 5, wherein an opening is formed on the shielding, the optical sensor is disposed at least partially inside the shielding and through the opening.

7. The device of claim 6, wherein an ultraviolet blocking cover is disposed over the opening on the shielding for blocking a leakage of the seed laser beam.

8. The device of claim 7, further comprising:
an optical fiber cable configured for transmitting a signal of the optical emission, a first end of the optical fiber penetrates through the ultraviolet blocking cover and is connected to the optical sensor, a second end of the optical fiber cable is connected to the spectrometer.

9. The device of claim 5, wherein the gain medium flows from a fluid inlet to a fluid outlet, and the optical sensor is disposed relatively adjacent to the fluid inlet and relatively away from the fluid outlet.

10. A method, comprising:
producing a seed laser beam by a laser source;
amplifying power of the seed laser beam by an amplifier;
sensing an optical emission by an optical sensor disposed in the amplifier;
measuring a spectrum of the optical emission; and
determining an operational status of the amplifier according to the spectrum of the optical emission.

11. The method of claim 10, wherein the gain medium is a gas mixture comprising carbon dioxide and nitrogen.

12. The method of claim 11, wherein the amplifier comprises a plurality of electrodes and gain medium, and amplifying power of the seed laser comprises:
applying radio-frequency signal on the electrodes for pumping the gain medium; and
directing the seed laser beam through the gain medium.

13. A device, comprising:
a laser source configured to produce a seed laser beam;
an extreme ultraviolet generating vessel, the seed laser beam being directed to the extreme ultraviolet generating vessel to form laser-produced plasma, the laser-produced plasma being configured to generate an extreme ultraviolet light;
an optical component, the extreme ultraviolet light transmitting through the optical component being utilized to in lithographing a wafer;
an optical sensor configured for sensing an optical emission generated while the seed laser beam being amplified before entering the extreme ultraviolet generating vessel; and
a spectrometer coupled with the optical sensor and configured to measure a spectrum of the optical emission.

14. The device of claim 13, wherein the gain medium is a gas mixture comprising carbon dioxide and nitrogen.

15. The device of claim 13, further comprising:
   an amplifier comprising gain medium and a discharging unit, the discharging unit being configured to pump the gain medium for amplifying power of the seed laser beam; and
   a processor coupled with the spectrometer and configured to determine an operational status of the amplifier according to the spectrum of the optical emission.

16. The device of claim 15, wherein the amplifier comprises:
   a plurality of amplifier components positioned along an optical path of the seed laser beam, the seed laser beam being sequentially amplified by the amplifier components, the optical sensor is coupled to one of the amplifier components.

17. The device of claim 15, wherein the amplifier comprises:
   a shielding; and
   a glass tube disposed in the shielding and configured to accommodate the gain medium,
   wherein the discharging unit comprises a plurality of electrodes disposed adjacent to the glass tube, and a radio-frequency signal is applied on the electrodes for pumping the gain medium.

18. The device of claim 17, wherein an opening is formed on the shielding, the optical sensor is disposed at least partially inside the shielding and through the opening.

19. The device of claim 18, wherein an ultraviolet blocking cover is disposed over the opening on the shielding for blocking a leakage of the seed laser beam.

20. The device of claim 19, further comprising:
   an optical fiber cable configured for transmitting a signal the optical emission, a first end of the optical fiber penetrates through the ultraviolet blocking cover and is connected to the optical sensor, a second end of the optical fiber cable is connected to the spectrometer.

* * * * *